United States Patent
Mis et al.

(10) Patent No.: US 7,550,849 B2
(45) Date of Patent: Jun. 23, 2009

(54) CONDUCTIVE STRUCTURES INCLUDING TITANIUM-TUNGSTEN BASE LAYERS

(75) Inventors: J. Daniels Mis, Cary, NC (US); Dean Zehnder, Hillsborough, NC (US)

(73) Assignee: Unitive International Limited, Curacao (AN)

( * ) Notice: Subject to any disclaimer, the term of this patent is extended or adjusted under 35 U.S.C. 154(b) by 0 days.

(21) Appl. No.: 11/765,648

(22) Filed: Jun. 20, 2007

(65) Prior Publication Data

US 2007/0241460 A1   Oct. 18, 2007

Related U.S. Application Data

(62) Division of application No. 10/879,411, filed on Jun. 29, 2004, now Pat. No. 7,244,671.

(60) Provisional application No. 60/490,340, filed on Jul. 25, 2003, provisional application No. 60/507,587, filed on Oct. 1, 2003.

(51) Int. Cl.
*H01L 23/48* (2006.01)
*H01L 23/52* (2006.01)

(52) U.S. Cl. .................. 257/750; 257/741; 257/773; 257/774; 257/E23.019

(58) Field of Classification Search .......... 257/741, 257/750, 773, 774, E23.019
See application file for complete search history.

(56) References Cited

U.S. PATENT DOCUMENTS

| | | | |
|---|---|---|---|
| 5,162,257 A | 11/1992 | Yung | |
| 5,234,149 A | 8/1993 | Katz et al. | |
| 5,293,006 A | 3/1994 | Yung | |
| 6,015,505 A | 1/2000 | David et al. | |
| 6,329,608 B1 | 12/2001 | Rinne et al. | |
| 6,388,203 B1 | 5/2002 | Rinne et al. | |
| 6,389,691 B1 | 5/2002 | Rinne et al. | |
| 6,392,163 B1 | 5/2002 | Rinne et al. | |
| 6,462,426 B1 | 10/2002 | Kelkar et al. | |
| 6,492,197 B1 | 12/2002 | Rinne | |
| 6,762,117 B2 * | 7/2004 | Lam et al. | 438/612 |
| 6,768,210 B2 | 7/2004 | Zuniga-Ortiz et al. | |
| 2002/0063340 A1 | 5/2002 | Sahara et al. | |
| 2002/0121702 A1 | 9/2002 | Higgins, III | |
| 2004/0209406 A1 | 10/2004 | Jan et al. | |
| 2006/0006532 A1 | 1/2006 | Zuniga-Ortiz et al. | |

FOREIGN PATENT DOCUMENTS

EP   0 292 057 A1   11/1988

OTHER PUBLICATIONS

International Search Report and The Written Opinion for PCT/US2004/022949; mailing date: Jan. 25, 2005.

* cited by examiner

*Primary Examiner*—Asok K Sarkar
(74) *Attorney, Agent, or Firm*—Myers Bigel Sibley & Sajovec, P.A.

(57) ABSTRACT

Methods may be provided for forming an electronic device including a substrate, a conductive pad on the substrate, and an insulating layer on the substrate wherein the insulating layer has a via hole therein exposing a portion of the conductive pad. In particular, a conductive structure may be formed on the insulating layer and on the exposed portion of the conductive pad. The conductive structure may include a base layer of titanium-tungsten (TiW) and a conduction layer of at least one of aluminum and/or copper. Moreover, the base layer of the conductive structure may be between the conduction layer and the insulating layer. Related devices are also discussed.

34 Claims, 4 Drawing Sheets

FIGURE 13

CONDUCTIVE STRUCTURES INCLUDING TITANIUM-TUNGSTEN BASE LAYERS

RELATED APPLICATIONS

This application claims the benefit of priority as a divisional of U.S. patent application Ser. No. 10/879,411 filed on Jun. 29, 2004, now U.S. Pat. No. 7,244,671, which claims the benefit of priority from U.S. Provisional Patent Application No. 60/490,340 filed on Jul. 25, 2003, and from U.S. Provisional Patent Application No. 60/507,587 filed on Oct. 1, 2003. The disclosures of all of the above referenced Patent Applications are hereby incorporated herein by reference in their entirety.

FIELD OF THE INVENTION

The present invention relates to the field of integrated circuits and more particularly to methods of forming conductive structures for integrated circuit devices and related structures.

BACKGROUND OF THE INVENTION

High performance microelectronic devices often use solder balls or solder bumps for electrical interconnection to other microelectronic devices. For example, a very large scale integration (VLSI) chip may be electrically connected to a circuit board or other next level packaging substrate using solder balls or solder bumps. This connection technology is also referred to as "Controlled Collapse Chip Connection—C4" or "flip-chip" technology, and will be referred to herein as solder bumps.

According to solder bump technology developed by IBM, solder bumps are formed by evaporation through openings in a shadow mask which is clamped to an integrated circuit wafer. For example, U.S. Pat. No. 5,234,149 entitled "Debondable Metallic Bonding Method" to Katz et al. discloses an electronic device with chip wiring terminals and metallization layers. The wiring terminals are typically essentially aluminum, and the metallization layers may include a titanium or chromium localized adhesive layer, a co-deposited localized chromium copper layer, a localized wettable copper layer, and a localized gold or tin capping layer. An evaporated localized lead-tin solder layer is located on the capping layer.

Solder bump technology based on an electroplating method has also been actively pursued. The electroplating method is particularly useful for larger substrates and smaller bumps. In this method, an "under bump metallurgy" (UBM) layer is deposited on a microelectronic substrate having contact pads thereon, typically by evaporation or sputtering. A continuous under bump metallurgy layer is typically provided on the pads and on the substrate between the pads to allow current flow during solder plating.

An example of an electroplating method with an under bump metallurgy layer is discussed in U.S. Pat. No. 5,162,257 entitled "solder Bump Fabrication Method" to Yung and assigned to the assignee of the present application. In this patent, the under bump metallurgy layer includes a chromium layer adjacent the substrate and pads, a top copper layer which acts as a solderable metal, and a phased chromium/copper layer between the chromium and copper layers. The base of the solder bump is preserved by converting the under bump metallurgy layer between the solder bump and contact pad into an intermetallic of the solder and the solderable component of the under bump metallurgy layer.

An example of a redistribution routing conductor is discussed in U.S. Pat. No. 6,389,691 entitled "Methods For Forming Integrated Redistribution Routing Conductors And Solder Bumps" to Rinne et al. and assigned to the assignee of the present application. In this patent, a redistribution routing conductor can be integrally formed together with an associated solder bump.

Notwithstanding the methods and structures discussed above, there continues to exist a need in the art for improved interconnection structures.

SUMMARY OF THE INVENTION

According to embodiments of the present invention, methods may be provided for forming an electronic device including a substrate, a conductive pad on the substrate, and an insulating layer on the substrate wherein the insulating layer has a via hole therein exposing a portion of the conductive pad. More particularly, a conductive structure may be formed on the insulating layer and on the exposed portion of the conductive pad. The conductive structure may include a base layer including titanium-tungsten (TiW) and a conduction layer including at least one of aluminum and/or copper. Moreover, the base layer of the conductive structure is between the conduction layer and the insulating layer.

In addition, forming the conductive structure may include forming a layer of titanium-tungsten on the insulating layer and on the exposed portions of the conductive pad, and forming the conduction layer including at least one of aluminum and/or copper on the layer of titanium-tungsten so that portions of the titanium-tungsten layer are exposed. After forming the conduction layer, portions of the layer of titanium-tungsten exposed by the conduction layer may be removed. More particularly, removing portions of the layer of titanium-tungsten may include etching the layer of titanium-tungsten using hydrogen peroxide. In an alternative, removing portions of the layer of titanium-tungsten may include etching the layer of titanium-tungsten using a mixture including hydrogen peroxide, potassium sulfate, benzotriazole, and sulfo-salicylic acid.

The base layer of the conductive structure may include a lip extending beyond the conduction layer of the conductive structure, and/or the conductive pad may include at least one of aluminum and/or copper. A second insulating layer may be formed on the conductive structure and on the first insulating layer so that the conductive structure is between the first and second insulating layers, and a second via hole in the second insulating layer may expose a portion of the conductive structure. Moreover, the first and second via holes may be offset. An interconnection structure (such as a solder bump) may also be formed on the exposed portion of the conductive structure, and an under bump metallurgy layer may be formed between the interconnection structure and the exposed portion of the conductive structure.

The conduction layer of the conductive structure may include an aluminum layer, and the conduction layer may also include a titanium layer between the aluminum layer and the base layer of the conductive structure. A portion of the conductive pad may be exposed between the insulating layer and the conductive structure. Moreover, the insulating layer may include at least one of benzocyclobutene, polyimide, silicon oxide, silicon nitride, and/or silicon oxynitride.

According to additional embodiments of the present invention, methods may be provided for forming an electronic device including a substrate and an insulating layer on the substrate. More particularly, a conductive structure may be formed on the insulating layer, and the conductive structure may include a base layer including titanium-tungsten (TiW) and a conduction layer including at least one of aluminum and/or copper. Moreover, the base layer of the conductive structure may be between the conduction layer and the insulating layer, and the base layer of the conductive structure may include a lip extending beyond the conduction layer of the conductive structure.

Forming the conductive structure on the insulating layer may include forming a layer of titanium-tungsten on the insulating layer, and after forming the layer of titanium-tungsten, the conduction layer may be formed on the layer of titanium-tungsten so that portions of the layer of titanium-tungsten are exposed. After forming the conduction layer, portions of the layer of titanium-tungsten exposed by the conduction layer may be removed. More particularly, removing portions of the layer of titanium-tungsten may include etching the layer of titanium-tungsten using hydrogen peroxide. In an alternative, removing portions of the layer of titanium-tungsten may include etching the layer of titanium-tungsten using a mixture including hydrogen peroxide, potassium sulfate, benzotriazole, and sulfo-salicylic acid.

The electronic device may include a conductive pad on the substrate, the insulating layer may have a via hole therein exposing a portion of the conductive pad, and forming the conductive structure may include forming the conductive structure on the insulating layer and on exposed portions of the conductive pad. More particularly, the conductive pad may include at least one of aluminum and/or copper. In addition, a portion of the conductive pad may be exposed between the insulating layer and the conductive structure.

A second insulating layer may be formed on the conductive structure and on the first insulating layer so that the conductive structure is between the first and second insulating layers. In addition, a second via hole may be formed in the second insulating layer exposing a portion of the conductive structure. Moreover, an interconnection structure (such as a solder bump) may be formed on the exposed portion of the conductive structure, and an under bump metallurgy layer may be formed between the interconnection structure and the exposed portion of the conductive structure.

The conduction layer of the conductive structure may include an aluminum layer, and the conduction layer may also include a titanium layer between the aluminum layer and the base layer of the conductive structure. In addition, the insulating layer may include at least one of benzocyclobutene, polyimide, silicon oxide, silicon nitride, and/or silicon oxynitride.

According to still additional embodiments of the present invention, an electronic device may include a substrate, a conductive pad, an insulating layer, and a conductive structure on the insulating layer. The conductive pad may be on the substrate, and the insulating layer may be on the substrate and on the conductive pad. In addition, the insulating layer may have a via hole therein exposing a portion of the conductive pad. The conductive structure may be on the insulating layer and on the exposed portion of the conductive pad. More particularly, the conductive structure may include a base layer comprising titanium-tungsten (TiW) and a conduction layer comprising at least one of aluminum and/or copper. Moreover, the base layer of the conductive structure may be between the conduction layer and the insulating layer. The base layer of the conductive structure may include a lip extending beyond the conduction layer of the conductive structure, and/or the conductive pad may include at least one of aluminum and/or copper.

In addition, a second insulating layer may be provided on the conductive structure and on the first insulating layer so that the conductive structure is between the first and second insulating layers. Moreover, the second insulating layer may have a second via hole therein exposing a portion of the conductive structure wherein the first and second via holes are offset. An interconnection structure (such as a solder bump) may be provided on the exposed portion of the conductive structure, and an under bump metallurgy layer may be provided between the interconnection structure and the exposed portion of the conductive structure.

The conduction layer of the conductive structure may include an aluminum layer, and the conduction layer may also include a titanium layer between the aluminum layer and the base layer of the conductive structure. A portion of the conductive pad may be exposed between the insulating layer and the conductive structure, and/or the insulating layer may include at least one of benzocyclobutene, polyimide, silicon oxide, silicon nitride, and/or silicon oxynitride.

According to yet additional embodiments of the present invention, an electronic device may include a substrate, an insulating layer on the substrate, and a conductive structure on the insulating layer. The conductive structure may include a base layer including titanium-tungsten (TiW) and a conduction layer including at least one of aluminum and/or copper. Moreover, the base layer of the conductive structure may be between the conduction layer and the insulating layer, and the base layer of the conductive structure may include a lip extending beyond the conduction layer of the conductive structure.

The electronic device may also include a conductive pad on the substrate, and the insulating layer may have a via hole therein exposing a portion of the conductive pad. In addition, a portion of the conductive structure may be on the exposed portion of the conductive pad. The conductive pad may include at least one of aluminum and/or copper, and a portion of the conductive pad may be exposed between the insulating layer and the conductive structure.

In addition, a second insulating layer may be provided on the conductive structure and on the first insulating layer so that the conductive structure is between the first and second insulating layers, and the second insulating layer may have a second via hole therein exposing a portion of the conductive structure. In addition, an interconnection structure (such as a solder bump) may be provided on the exposed portion of the conductive structure, and an under bump metallurgy layer may be provided between the interconnection structure and the exposed portion of the conductive structure.

Moreover, the conduction layer of the conductive structure may be an aluminum layer, and the conduction layer may also include a titanium layer between the aluminum layer and the base layer of the conductive structure. In addition, the insulating layer may include at least one of benzocyclobutene, polyimide, silicon oxide, silicon nitride, and/or silicon oxynitride.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, thicknesses of layers and regions are exaggerated for clarity. Like numbers refer to like elements throughout.

It will be understood that when an element such as a layer, region or substrate is referred to as being "on" another element, it can be directly on the other element, or intervening elements may also be present. In contrast, when an element is referred to as being "directly on" another element, there are no intervening elements present. Also, when an element is referred to as being "bonded" to another element, it can be directly bonded to the other element or intervening elements may be present. In contrast, when an element is referred to as being "directly bonded" to another element, there are no intervening elements present. It will also be understood that when an element is referred to as being "connected" or "coupled" to another element, it can be directly connected or coupled to the other element or intervening elements may be present. Finally, the term "directly" means that there are no intervening elements.

According to embodiments of the present invention, a conductive structure including an aluminum and/or copper layer may be provided on an organic and/or an inorganic insulating passivation layer. The conductive structure, for example, may be used as a redistribution routing line providing electrical connectivity between an input/output pad on a substrate and an interconnection structure (such as a solder bump) offset from the input/output pad. Conductive lines and solder bumps according to embodiments of the present invention may be used, for example, to provide structures for flip chip processing. In other alternatives, a conductive line according to embodiments of the present invention may provide interconnection between two conductive input/output pads, between a conductive input/output pad and another conductive line, and/or between two interconnection structures.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a conductive layer illustrated as a rectangle may, typically, have rounded or curved features. Thus, the regions illustrated in the figures are schematic in nature and their shapes are not intended to illustrate the precise shape of a region of a device and are not intended to limit the scope of the present invention.

Figure 4:
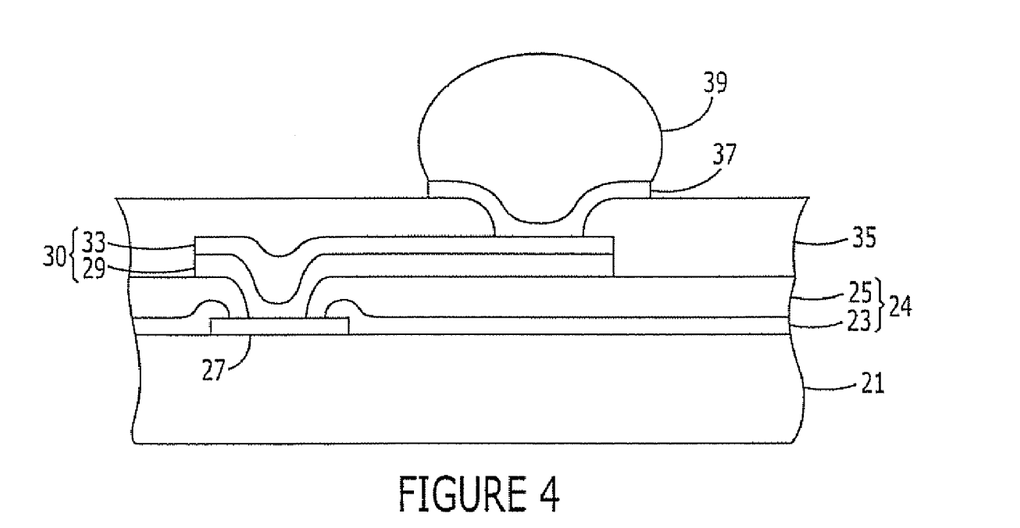

An electronic structure according to embodiments of the present invention is illustrated in FIG. 4. As shown in FIG. 4, an electronic substrate 21 may include a semiconductor material such as silicon (Si), gallium arsenide (GaAs), silicon germanium (SiGe), and/or sapphire. More particularly, the electronic substrate 21 may include a plurality of electronic devices such as transistors, diodes, resistors, capacitors, and/or inductors, providing a defined functionality. In addition, a conductive input/output pad 27 (such as a copper and/or aluminum pad) may provide electrical connectivity for electrical circuitry of the substrate 21. An insulating passivation layer 24 may include an inorganic layer 23 (such as a layer of silicon oxide, silicon nitride, and/or silicon oxynitride) and an organic layer 25 (such as a layer of benzocyclobutene BCB and/or polyimide). In an alternative, the insulating passivation layer 24 may include only one of an inorganic layer or an organic layer.

As further shown in FIG. 4, a via hole in the insulating passivation layer 24 may expose portions of the conductive input/output pad 27, and a conductive line 30 may be provided on the insulating passivation layer 24. More particularly, the conductive line 30 may include a base layer 29 including titanium-tungsten (TiW) and a conduction layer 33 including aluminum and/or copper. According to particular embodiments of the present invention, the conduction layer 33 may include a stack of aluminum on titanium (Ti/Al), aluminum on titanium on titanium-tungsten (TiW/Ti/Al), copper on titanium (Ti/Cu), copper on titanium-tungsten (TiW/Cu), aluminum on titanium-tungsten on titanium nitride (TiN/TiW/Al), and/or copper on titanium-tungsten on titanium nitride (TiN/TiW/Cu). A conduction layer 33 including a stack of aluminum on titanium may getter oxygen from a titanium-tungsten base layer.

A second insulating passivation layer 35 on the conductive line 30 and on the first insulting passivation layer 24 includes a second via hole therein exposing a portion of the conductive line 30 offset from the conductive input/output pad 27. Moreover, an under bump metallurgy layer 37 and an interconnection structure 39 (such as a solder bump) may be provided on exposed portions of the conductive line 30. Accordingly, the conductive line 30 may allow redistribution of the interconnection structure 39 from the respective conductive input/output pad 27, and the interconnection structure 39 may provide electrical and/or mechanical interconnection to a next level of packaging.

While not shown in FIG. 4, the base layer 29 of the conductive line 30 may include a lip extending beyond the conduction layer 33. In addition or in an alternative, portions of the conductive input/output pad 27 may be exposed between the insulating passivation layer 24 and the conductive line 30. Stated in other words, a width of the conductive line 30 may be less than a width of portions of the conductive input/output pad 27 exposed through the via hole in the insulating passivation layer 24.

Figure 1:
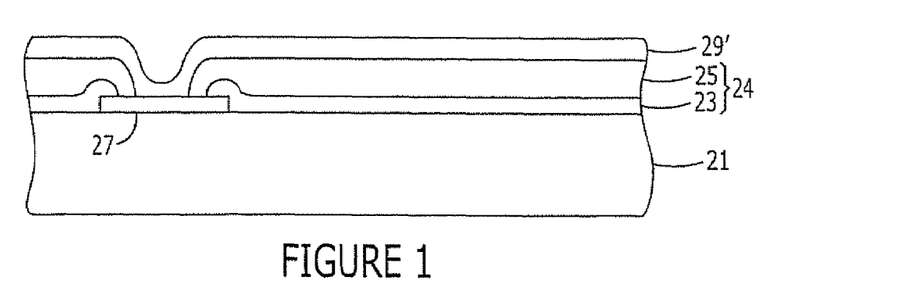
FIGS. 1, 2A-B, 3, and 4 are cross-sectional views illustrating steps of forming conductive structures and resulting conductive structures according to embodiments of the present invention.

Methods of forming structures illustrated in FIG. 4 according to embodiments of the present invention are illustrated in FIGS. 1-4. As shown in FIG. 1, an insulating passivation layer 24 including an inorganic layer 23 (such as silicon oxide, silicon nitride, and/or silicon oxynitride) and/or an organic layer 25 (such as benzocyclobutene and/or polyimide) can be formed on a substrate 21. More particularly, an inorganic layer 23 may be formed on the substrate, and an organic layer 25 may be formed on the inorganic layer 23 opposite the substrate 21. The substrate 21 may include a material such as silicon (Si), gallium arsenide (GaAs), silicon germanium (SiGe), and/or sapphire, and the electronic substrate may include electronic devices such as transistors, diodes, resistors, capacitors, and/or inductors.

In addition, a conductive input/output pad 27 (such as an aluminum and/or copper pad) may be included on the substrate 21, and the conductive input/output pad 27 may provide electrical connectivity for circuitry of the substrate 21. Moreover, a via hole in the insulating passivation layer 24 may expose at least a portion of the conductive pad 27. As further shown in FIG. 1, a blanket layer of titanium-tungsten 29' may be formed on the insulating passivation layer 24 and on portions of the conductive input/output pad 27 exposed through the via hole in the insulating passivation layer 24.

Prior to forming the blanket layer of titanium-tungsten 29', the exposed surface of the conductive input/output pad 27 may be subjected to a wet and/or dry pretreatment to reduce a surface oxide thereof and to reduce a contact resistance between the conductive input/output pad 27 and the titanium-tungsten formed thereon. For example, the exposed surface of the conductive input/output pad 27 may be subjected to a sputter clean, and the blanket layer of titanium-tungsten 29' can be formed by sputtering. Moreover, the sputter clean and the sputter deposition can be performed in a same process chamber to reduce further oxidation and/or contamination. In alternatives, the exposed surface of the conductive input/output pad 27 may be subjected to a wet etch/clean, a dry etch/clean, and/or a plasma etch/clean prior to forming the blanket layer of titanium-tungsten, and/or the blanket layer of titanium-tungsten 29 may be formed by evaporation.

More particularly, the blanket layer of titanium-tungsten 29' may be formed to a thickness of approximately 100 Angstroms. The blanket layer of titanium may have a composition of approximately 10% titanium and 90% tungsten.

With an aluminum conductive input/output pad 27, the blanket layer of titanium-tungsten 29' may provide passivation of portions of the aluminum conductive input/output pad 27 exposed through the via hole in the insulating passivation layer 24. The blanket layer of titanium-tungsten 29' may also getter oxygen from the surface of the aluminum conductive input/output pad 27.

Figure 2A:
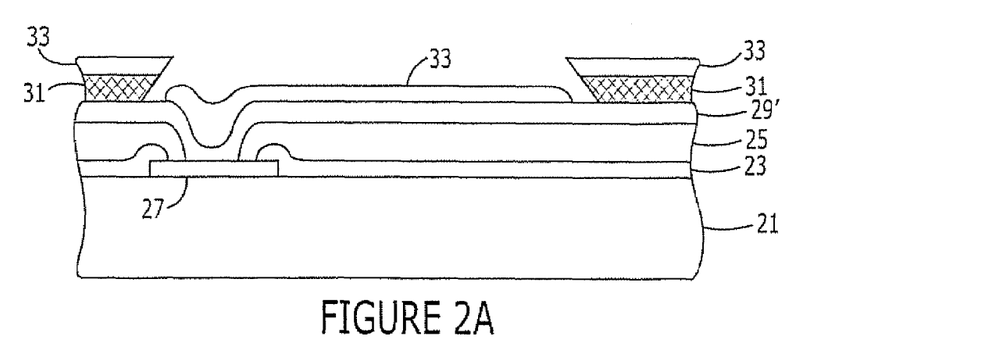

As shown in FIG. 2A, a conduction layer 33 may be formed using a using a lift-off technique. More particularly, a resist layer 31 may be formed and patterned to provide a lift-off stencil with an opening exposing portions of the blanket layer of titanium-tungsten 29'. A layer of metal 33 is then formed on the resist layer 31 and on exposed portions of the titanium-tungsten (TiW) layer 29. The metal layer 33 may include aluminum and/or copper, and the metal layer 33 may be formed by evaporation. The metal layer 33 may include a stack of metal layers such as aluminum on titanium (Ti/Al), aluminum on titanium on titanium-tungsten (TiW/Ti/Al), copper on titanium (Ti/Cu), copper on titanium-tungsten (TiW/Cu), aluminum on titanium-tungsten on titanium nitride (TiN/TiW/Al), and/or copper on titanium-tungsten on titanium nitride (TiN/TiW/Cu). For example, the conduction layer may include a titanium layer having a thickness in the range of approximately 200 Angstroms to approximately 1000 Angstroms on the blanket layer of titanium-tungsten 29', and an aluminum layer having a thickness of approximately 2 µm. A conduction layer 33 including a stack of aluminum on titanium may getter oxygen from a titanium-tungsten base layer.

The structure including the resist layer 31 and the conduction layer 33 may then be exposed to a solvent bath so that the resist layer 31 dissolves and portions of the metal layer 33 thereon lift off. Portions of the blank layer of titanium-tungsten (TiW) 29' not covered by the remaining portions of the metal layer 33 may then be removed using an etch chemistry that selectively etches titanium-tungsten with respect to aluminum and/or copper to provide the structure of FIG. 3 with the conductive line 30 including a base layer of titanium-tungsten 29 and a conduction layer 33. With a conduction layer 33 including a stack of aluminum on titanium, exposed portions of the blanket layer of titanium-tungsten 29' (10% Ti and 90% W) may be etched using an etching agent such as hydrogen peroxide ($H_2O_2$) in water (30% $H_2O_2$), and/or a mixture including hydrogen peroxide ($H_2O_2$), water, potassium sulfate, benzotriazole, and sulfo-salicylic acid.

Figure 2B:
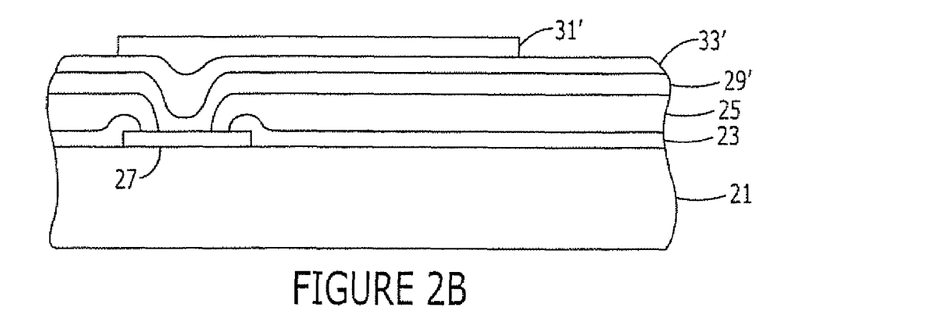
Figure 3:
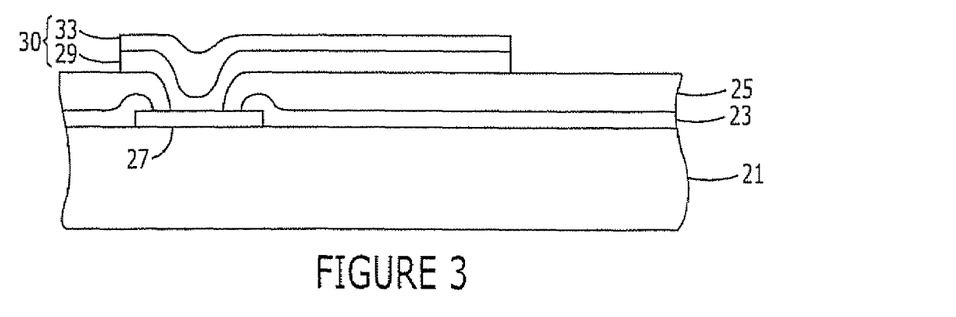

In an alternative, the conduction layer 33 can be formed using photolithography/etch techniques as illustrated, for example, in FIG. 2B, and exposed portions of the blanket layer of titanium-tungsten 29' can be removed to provide the structure of FIG. 3. More particularly, a blanket metal layer 33' including aluminum and/or copper may be sputtered on the blanket layer of titanium-tungsten 29'. The blanket metal layer 33' may be a stack of metal layers such as aluminum on titanium (Ti/Al), aluminum on titanium on titanium-tungsten (TiW/Ti/Al), copper on titanium (Ti/Cu), copper on titanium-tungsten (TiN/Cu), aluminum on titanium-tungsten on titanium nitride (TiN/TiN/Al), and/or copper on titanium-tungsten on titanium nitride (TiN/TiW/Cu). For example, the metal layer 33' may include a titanium layer having a thickness in the range of approximately 200 Angstroms to approximately 1000 Angstroms on the blanket layer of titanium-tungsten 29', and an aluminum layer having a thickness of approximately 2 µm.

An etch mask 31' may then be formed on the metal layer 33'. For example, a layer of photoresist may be deposited, exposed, and developed to provide the etch mask 31' on the metal layer 33'. Portions of the metal layer 33' exposed by etch mask 31' may then be removed using a wet and/or dry etch chemistry suitable to etch aluminum and/or copper to provide the conduction layer 33. Portions of the blanket layer of titanium-tungsten 29' not covered by the remaining conduction layer 33 may then be removed using an etch chemistry that selectively etches TiW with respect to aluminum and/or copper. With a conduction layer 33 including a stack of aluminum on titanium, exposed portions of the blanket layer of titanium-tungsten 29' (10% Ti and 90% W) may be etched using an etching agent such as hydrogen peroxide ($H_2O_2$) in water (30% $H_2O_2$), and/or a mixture including hydrogen peroxide ($H_2O_2$), water, potassium sulfate, benzotriazole, and sulfo-salicylic acid.

The etch mask 31' can be removed after patterning the conduction layer 33 and the base layer 29 to provide the structure illustrated in FIG. 3 including the conductive line 30. In an alternative, the mask layer 31' may be removed before etching the TiW layer 29' after etching the metal layer 33'.

Accordingly, the structure of FIG. 3 may be provided using either lift-off techniques as discussed above with regard to FIG. 2A or photolithography techniques as discussed above with regard to FIG. 2B. In either case, a plasma etch may be used to clean up residual metal after patterning the conduction layer 33 and the TiW base layer 29.

While not shown in FIG. 3, a lip of the titanium-tungsten base layer 29 may extend beyond the conduction layer 33 after patterning the titanium-tungsten base layer 29 using the conduction layer 33 as an etch mask. More particularly, the lip of the titanium-tungsten base layer may be self-aligned with respect to the conduction layer 33 and extend a uniform distance from the conduction layer 33 around a periphery of the conductive line 30. Without being bound to a particular mechanism, the Applicants theorize that electro-chemical properties of the etching agent in proximity with the conduction layer 33 (such as an aluminum conduction layer) may reduce a reactivity of the etching agent with respect to the titanium-tungsten in proximity with the conduction layer.

By maintaining a lip of the base layer 29, an undercutting of the conduction layer 33 may be reduced and/or eliminated and a reliability of the conductive line may be increased. If the base layer 29 is patterned in a manner that allows undercutting of the conduction layer 33, the resulting undercut region may provide a blind cavity for entrapment of potential corrosives and/or contaminants; the undercut region may create potential stress concentration points in packaged devices; and/or the undercut region may reduce a bond strength between the conductive line 30 and the insulating passivation layer 24. By reducing and/or eliminating undercutting, entrapment of corrosives and/or contaminants can be reduced, creation of stress concentration points may be reduced, and/or bond strengths may be increased.

In addition, the conductive line 30 may be protected with an inorganic and/or organic insulating passivation layer 35 as shown in FIG. 4. The insulating passivation layer 35 may include benzocyclobutene (BCB), polyimide, silicon oxide, silicon nitride, and/or silicon oxynitride. Moreover, a via hole in the insulating passivation layer 35 may expose a portion of the conductive line 30, an under bump metallurgy layer 37 may be formed on exposed portions of the conductive line 30, and an interconnection structure 39 (such as a solder bump) may be formed on the under bump metallurgy layer 37. The interconnection structure 39 may be formed, for example, using one or more bumping processes such as evaporation, electroplating, electro-less plating, and/or screen printing. Under bump metallurgy layers and solder bumps are discussed, for example, in U.S. Pat. No. 6,492,197 entitled "Trilayer/bilayer Solder Bumps And Fabrication Methods Therefor" to Rinne; U.S. Pat. No. 6,392,163 entitled "Controlled-Shaped Solder Reservoirs For Increasing The Volume Of Solder Bumps" to Rinne et al; U.S. Pat. No. 6,389,691 entitled "Methods For Forming Integrated Redistribution Routing Conductors And Solder Bumps" to Rinne et al.; U.S. Pat. No. 6,388,203 entitled "Controlled-Shaped Solder Reservoirs For Increasing The Volume Of Solder Bumps, And Structures Formed Thereby" to Rinne et al.; U.S. Pat. No. 6,329,608 entitled "Key-Shaped Solder Bumps And Under Bump Metallurgy" to Rinne et al.; and U.S. Pat. No. 5,293,006 entitled "Solder Bump Including Circular Lip" to Yung. The disclosures of the above referenced patents are incorporated herein in their entirety by reference. Accordingly, the conductive line 30 may provide electrical connection between the conductive input/output pad 27 and the interconnection structure 39 that is laterally offset from the conductive input/output pad.

In an alternative, a second conductive line (not shown) may be formed on the insulating passivation layer 35 and exposed portions of the first conductive line 30, and a third insulating passivation layer (not shown) may be provided on the second conductive line (not shown) and the insulating passivation layer 35. A via hole be provided in the third insulating passivation layer exposing portions of the second conductive line. Accordingly, multiple levels of conductive lines may be used to provide electrical connection between a conductive input/output pad and a respective interconnection structure. In an alternative or in addition, one or more levels of conductive lines may be used to provide electrical connection between two or more conductive input/output pads.

Steps of forming conductive lines according to additional embodiments of the present invention are illustrated in FIGS. 5-8. More particularly, a titanium-tungsten (TiW) base enhancement described with respect to FIGS. 5-8 may reduce an undercut region that may otherwise be generated beneath wiring formed using wet etch process methods. Undercut regions beneath microelectronic structures may generally be undesirable because a reduced base area may reduce bond strength; an undercut region may provide a blind cavity for entrapment of potential corrosives and contaminants; and an undercut may create potential stress concentration points in packaged devices.

According to embodiments of the present invention, a conductive line may be provided on an insulating passivation layer of an electronic device with the conductive line including a conduction layer on a metal base layer (different than the conduction layer) and the metal base layer being between the conduction layer and the insulating passivation layer. More particularly, a lip of the metal base layer may extend beyond edges of the conductive line. For example, the conduction layer may be a layer of aluminum, and the metal base layer may be a layer of titanium-tungsten (TiW). More particularly, an aluminum conduction layer may have a thickness of approximately 2 μm, and a TiW base layer may have a thickness of approximately 1000 Å. In addition, a Titanium barrier layer may be provided between the aluminum wiring layer and the TiW base layer, and the Ti barrier layer may have a thickness in the range of approximately 200 Å to 1000 Å.

Figure 5:
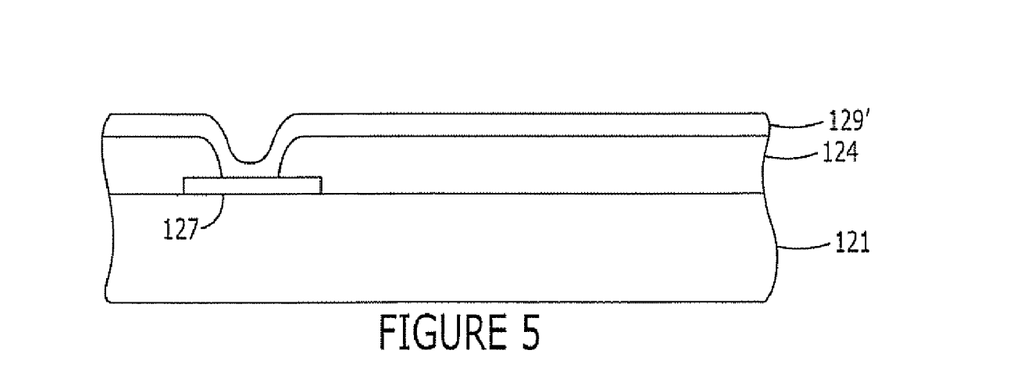
FIGS. 5-9 are cross-sectional views illustrating steps of methods of forming conductive structures and resulting conductive structures according to additional embodiments of the present invention.

Methods of forming conductive lines including conduction layers on metal base layers according to embodiments of the present invention are illustrated in FIGS. 5-9. As shown in FIG. 5, a substrate 121 may include electronic devices (such as transistors, diodes, resistors, capacitors, and/or inductors) with a conductive input/output pad 127 and an insulating passivation layer 124 thereon. The substrate 121, for example, may be a silicon substrate, a gallium arsenide (GaAs) substrate, a silicon germanium (SiGe) substrate, and/or a sapphire substrate. The insulating passivation layer 124 may include an insulating organic and/or an insulating inorganic material. More particularly, the insulating passivation layer 124 may include benzocyclobutene (BCB), polyimide, silicon oxide, silicon nitride, and/or silicon oxynitride. The insulting passivation layer 124 may also be patterned to provide a via therein exposing a portion of the conductive input/output pad 127. The conductive input/output pad 127 may be an aluminum input/output pad.

A blanket layer 129' of a metal may be formed on the insulating passivation layer 124 and on exposed portions of the conductive input/output pad 127. For example, a blanket layer of titanium-tungsten (TiW) having a thickness of approximately 1000 Å may be formed on the insulating passivation layer 124 and on exposed portions of the conductive input/output pad 127. Moreover, the blanket layer of titanium-tungsten may be formed by sputtering and/or evaporation to have a composition of approximately 10% Ti and 90% W. Moreover, exposed portions of the conductive input/output pad 127 may be pretreated prior to forming the blanket layer 129' of metal using a wet and/or dry pretreatment. A wet and/or dry pretreatment, for example, may be used to reduce a surface oxide on the conductive input/output pad 127 to thereby reduce a contact resistance between the conductive input/output pad 127 and the metal of the blanket layer 129'. More particularly, the pretreatment may include sputtering to reduce a surface oxide on the conductive input/output pad 127. In addition or in an alternative, a plasma treatment may be used to clean a surface of the insulating passivation layer 124 and/or the conductive input/output pad 127.

Figure 6:
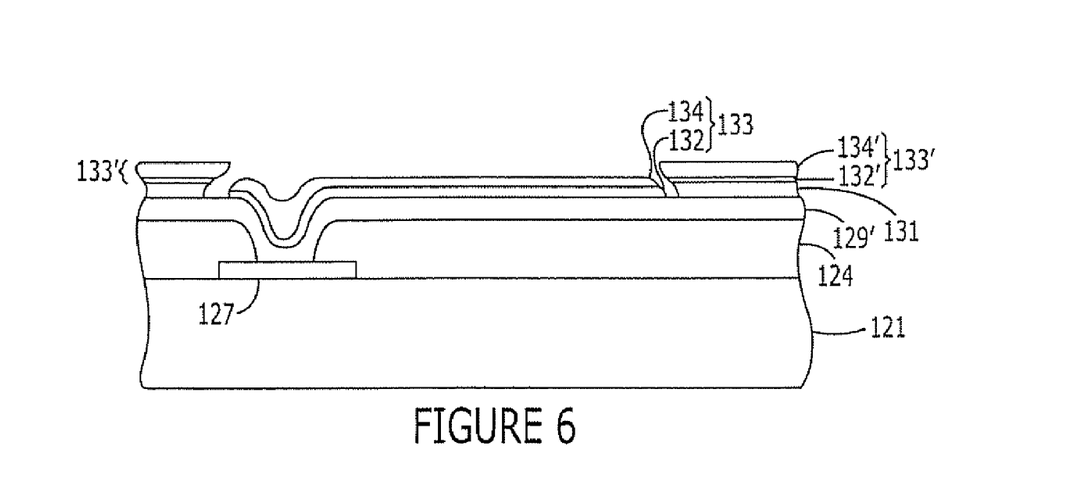

As shown in FIG. 6, a lift-off technique can then be used to form a patterned conduction layer. For example, a patterned layer of photoresist 131 may expose portions of the blanket layer 129' of metal where a conduction layer 133 is to be provided wherein the conduction layer includes a metal not included in the metal of the blanket layer 129'. For example, the conduction layer 133 may include a layer of Titanium (Ti) 132 and a layer of aluminum (Al) 134. More particularly, the titanium layer 132 may have a thickness in the range of approximately 200 Å to 1000 Å, and the aluminum layer 134 may have a thickness of approximately 2 μm. In various alternatives, the conduction layer 133 may include sequential layers of aluminum on titanium (Ti/Al); aluminum on titanium on titanium-tungsten (TiW/Ti/Al); sequential layers of copper on titanium (Ti/Cu); copper on titanium-tungsten (TiW/Cu); aluminum on titanium-tungsten on titanium nitride (TiN/TiW/Al); and/or copper on titanium-tungsten on titanium nitride (TiN/TiW/Cu). A conduction layer 133 including a stack of aluminum on titanium may getter oxygen from a titanium-tungsten base layer.

As shown, sacrificial portions of the conduction layer 133' may also be formed on the photoresist 131. The photoresist 131 and sacrificial portions of the conduction layer 133' thereon can be removed thereby providing the conduction layer 133 on the blanket layer 129'. While a lift-off technique is discussed, the conduction layer 133 may be formed using conventional photolithography/etch techniques, such as including a wet etch through an etch mask.

Figure 7:
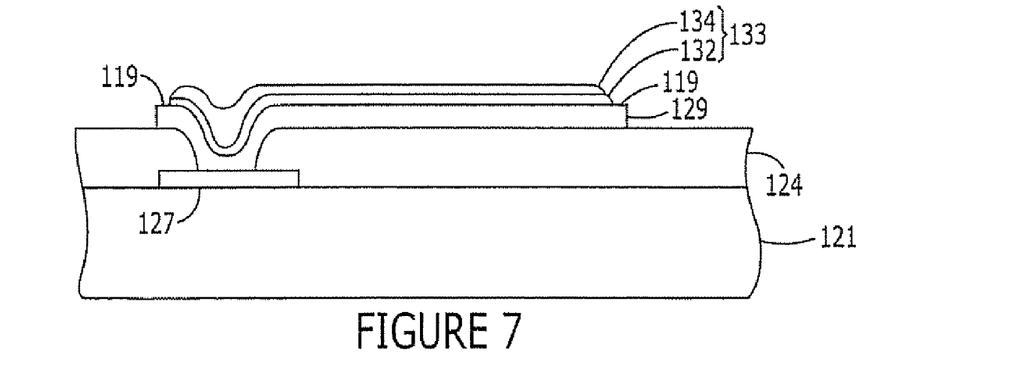

A wet etch can then be performed on the blanket layer 129' of metal without using a mask other than the conduction layer 133 to provide the base layer 129 having lips 119 extending beyond the conduction layer 133, as shown in FIG. 7. According to particular embodiments of the present invention, the metal base layer 129 may be a titanium-tungsten (10% Tl and 90% W) base layer, the conduction layer 133 may include aluminum layer 134 and titanium layer 132, and the wet etch may be performed using hydrogen peroxide ($H_2O_2$) in Water (30% $H_2O_2$). In an alternative, the metal base layer 129 may be a titanium-tungsten (10% Tl and 90% W) base layer, the conduction layer 133 may include aluminum layer 134 and titanium layer 132, and the wet etch may be performed using a mixture of hydrogen peroxide ($H_2O_2$), water, potassium sulfate, benzotriazle, and sulfo-salicylic acid.

According to embodiments of the present invention, the lip 119 of the base layer 129 may be formed to extend beyond the conduction layer 133 without requiring a mask (other than the conduction layer 133). By forming the base layer 129 without requiring a mask, the lip 119 may be self-aligned with respect to conduction layer 133 extending a uniform distance therefrom. The lip 119 may thus reduce undercutting of the conduction layer 133 thereby improving reliability of the resulting structure. More particularly, the lip 119 may increase an area of contact with the insulating passivation layer 124 thereby improving adhesion therewith. By reducing undercutting, generation of cracks in the conduction layer 133 may be reduced. Without being bound to a particular mechanism, the Applicants theorize that electro-chemical properties of the etching-agent in proximity with the conduction layer 133 (such as an aluminum conduction layer) may reduce a reactivity of the etching agent with respect to the titanium-tungsten in proximity with the conduction layer.

Figure 8:
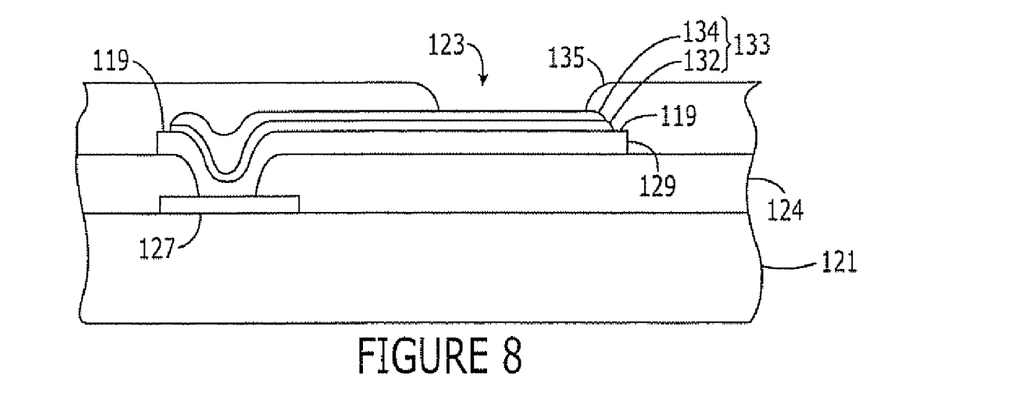

As shown in FIG. 8, a second insulating passivation layer 135 may be formed on the first insulating passivation layer 124, on the conduction layer 133, and on the lip 119 of the base layer 129. Moreover, a via hole 123 may be provided though the second insulating passivation layer 135 thereby exposing a portion of the conduction layer 133.

Figure 9:
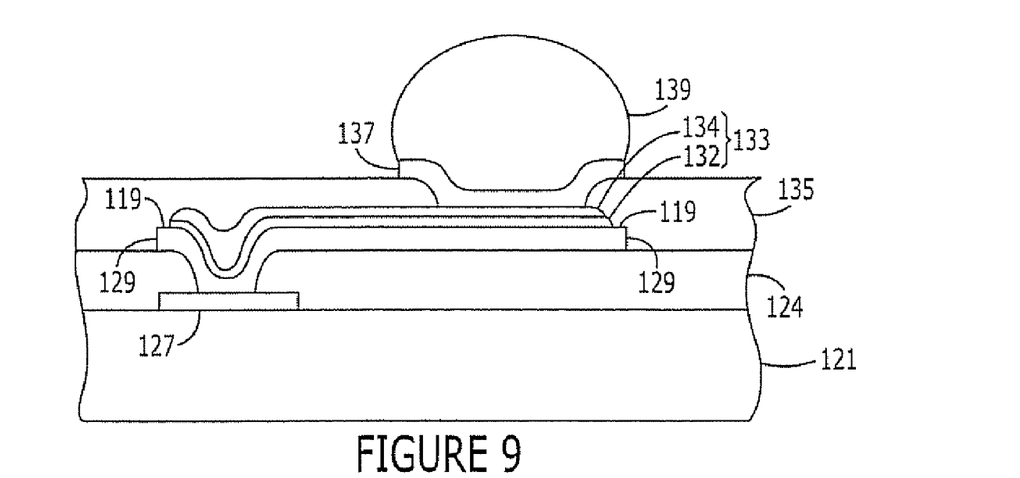
Figure 10:
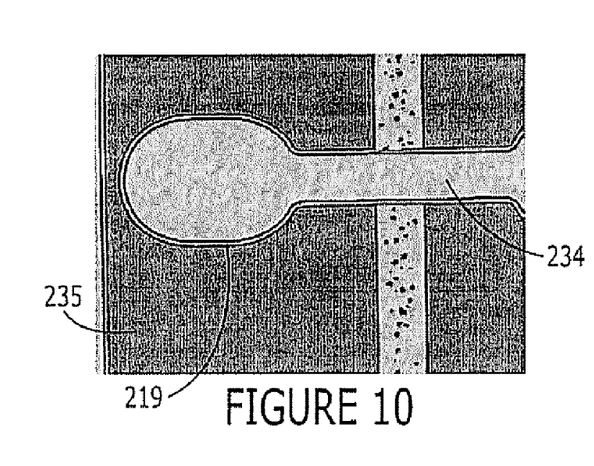
FIGS. 10-13 are photographs illustrating conductive structures according to yet additional embodiments of the present invention.

As shown in FIG. 9, an interconnection structure 139 (such as a solder bump) may be formed on the exposed portion of the conduction layer 133. Accordingly, a conductive line (including the conduction layer 133 and the base layer 129) may provide redistribution from a conductive input/output pad 127 to an interconnection structure 139 (such as a solder bump). Moreover, the second insulating passivation layer 135 may include an organic and/or an inorganic insulating material. More particularly, the second insulating passivation layer may include benzocyclobutene (BCB), polyimide, silicon oxide, silicon nitride, and/or silicon oxynitride. In an alternative, the conductive line (including conduction layer 133 and base layer 129) may provide interconnection between the conductive input/output pad 127 and another contact pad on the substrate 135.

Various structures including TiW base layers and Al wiring layers according to embodiments of the present invention are illustrated in the photographs of FIGS. 10-13. As shown in the top view of FIG. 10, a conductive structure may be provided on an insulating passivation layer 235, and the conductive structure may include an aluminum conduction layer 234 on a titanium-tungsten base layer so that the titanium-tungsten base layer is between the aluminum conduction layer 234 and the insulating passivation layer 235. Moreover, a lip 219 of the titanium-tungsten base layer extends beyond the aluminum conduction layer 234 a relatively uniform distance around the periphery of the conductive structure. As shown, the conductive structure may have elongate and enlarged width portions.

Figure 11:
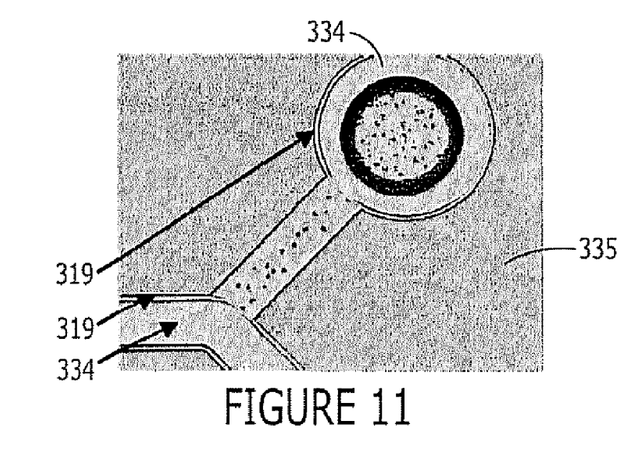

FIG. 11 is a top view of additional conductive structures on an insulating passivation layer 335 according to embodiments of the present invention. As shown in FIG. 11, aluminum conduction layers 334 may be provided on respective titanium-tungsten base layers such that lips 319 of the titanium-tungsten base layers extend beyond the aluminum conduction layers 334 around the periphery of the conductive structures.

Figure 12:
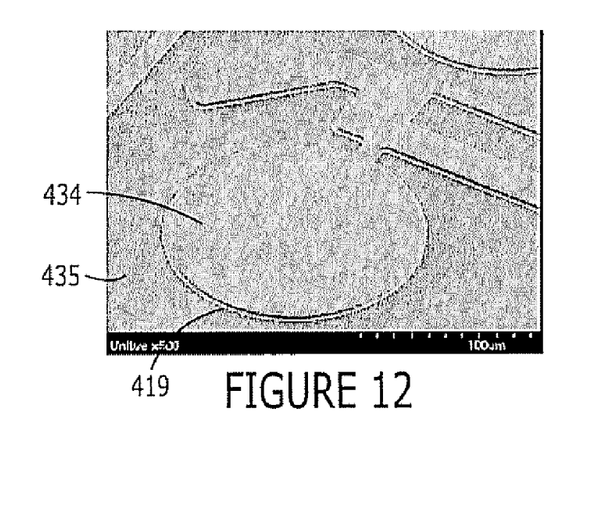

FIG. 12 is a top view of still additional conductive structures on an insulating passivation layer 435 according to embodiments of the present invention. As shown in FIG. 12, an aluminum conduction layer 434 may be provided on a respective titanium-tungsten base layer such that a lip 419 of the titanium-tungsten base layer is extends beyond the aluminum conduction layer 434 a relatively uniform distance around the periphery of the conductive structure.

Figure 13:
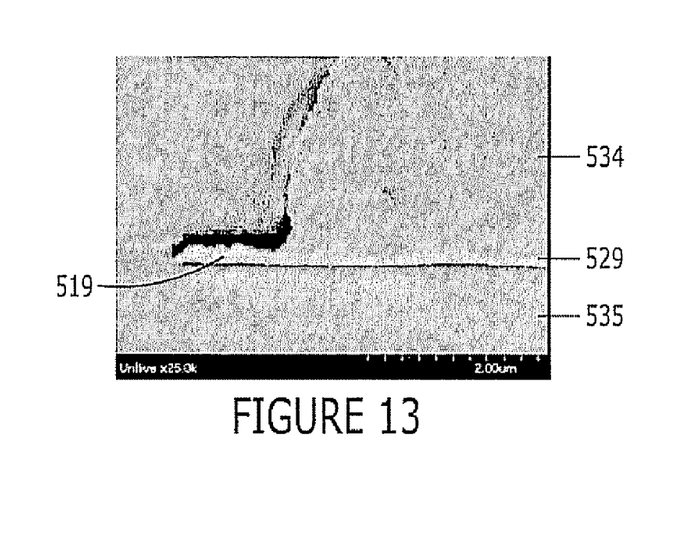

FIG. 13 is a photograph of a cross-section of a conductive structure according to embodiments of the present invention. As shown in FIG. 13, the conductive structure may be formed on an insulating passivation layer 535, and the conductive structure may include a titanium-tungsten base layer 529 and an aluminum conduction layer 534. More particularly, the titanium-tungsten base layer 529 may include a lip 519 extending beyond the aluminum conduction layer 534.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An electronic device comprising:
   a substrate;
   a conductive pad on the substrate;
   an insulating layer on the substrate, the insulating layer having a via hole therein exposing a portion of the conductive pad; and
   a conductive structure on the insulating layer and on the exposed portion of the conductive pad, the conductive structure including a base layer comprising titanium-tungsten (TiW) and a conduction layer comprising at least one of aluminum and/or copper, wherein the base layer of the conductive structure is between an entirety of the conduction layer and the insulating layer.

2. An electronic device according to claim 1 wherein the base layer of the conductive structure includes a lip extending beyond the conduction layer of the conductive structure wherein the lip of the base layer extends beyond the conduction layer in a direction parallel with respect to a surface of the substrate a relatively uniform distance around a periphery of the conductive structure.

3. An electronic device according to claim 1 wherein the conductive pad comprises at least one of aluminum and/or copper.

4. An electronic device according to claim 1 further comprising:
   a second insulating layer on the conductive structure and on the first insulating layer so that the conductive structure is between the first and second insulating layers, the second insulating layer having a second via hole therein exposing a portion of the conductive structure wherein the first and second via holes are offset.

5. An electronic device according to claim 4 further comprising:
   an interconnection structure on the exposed portion of the conductive structure.

6. An electronic device according to claim 5 further comprising:
   an under bump metallurgy layer between the interconnection structure and the exposed portion of the conductive structure.

7. An electronic device according to claim 5 wherein the interconnection structure comprises solder.

8. An electronic device according to claim 1 wherein the conduction layer of the conductive structure comprises an aluminum layer.

9. An electronic device according to claim 8 wherein the conduction layer of the conductive structure further comprises a titanium layer between the aluminum layer and the base layer of the conductive structure.

10. An electronic device according to claim 1 wherein a width of the conductive structure is less than a width of a width of portions of the conductive pad exposed through the via hole so that a portion of the conductive pad is exposed between the insulating layer and the conductive structure.

11. An electronic device according to claim 1 wherein the insulating layer comprises at least one of benzocyclobutene, polyimide, silicon oxide, silicon nitride, and/or silicon oxynitride.

12. An electronic device according to claim 1 wherein and entirety of the conduction layer is conformal with respect to the base layer.

13. An electronic device comprising:
   a substrate;
   an insulating layer on the substrate; and
   a conductive structure on the insulating layer, the conductive structure including a base layer comprising titanium-tungsten (TiW) and a conduction layer comprising at least one of aluminum and/or copper, wherein the base layer of the conductive structure is between the conduction layer and the insulating layer, and wherein the base layer of the conductive structure includes a lip extending beyond the conduction layer of the conductive structure wherein the lip of the base layer extends beyond the conduction layer in a direction parallel with respect to a surface of the substrate a relatively uniform distance around a periphery of the conductive structure.

14. An electronic device according to claim 13 further comprising:
   a conductive pad on the substrate wherein the insulating layer has a via hole therein exposing a portion of the conductive pad, and wherein a portion of the conductive structure is on the exposed portion of the conductive pad.

15. An electronic device according to claim 14 wherein the conductive pad comprises at least one of aluminum and/or copper.

16. An electronic device according to claim 14 wherein a width of the conductive structure is less than a width of a width of portions of the conductive pad exposed through the via hole so that a portion of the conductive pad is exposed between the insulating layer and the conductive structure.

17. An electronic device according to claim 13 further comprising:
   a second insulating layer on the conductive structure and on the first insulating layer so that the conductive structure is between the first and second insulating layers, the second insulating layer having a second via hole therein exposing a portion of the conductive structure.

18. An electronic device according to claim 17 further comprising:
   an interconnection structure on the exposed portion of the conductive structure.

19. An electronic device according to claim 18 further comprising:
   an under bump metallurgy layer between the interconnection structure and the exposed portion of the conductive structure.

20. An electronic device according to claim 18 wherein the interconnection structure comprises solder.

21. An electronic device according to claim 13 wherein the conduction layer of the conductive structure comprises an aluminum layer.

22. An electronic device according to claim 21 wherein the conduction layer of the conductive structure further comprises a titanium layer between the aluminum layer and the base layer of the conductive structure.

23. An electronic device according to claim 13 wherein the insulating layer comprises at least one of benzocyclobutene, polyimide, silicon oxide, silicon nitride, and/or silicon oxynitride.

24. An electronic device according to claim 13 wherein the base layer of the conductive structure is between an entirety of the conduction layer and the insulating layer.

25. An electronic device according to claim 13 wherein an entirety of the conduction layer is conformal with respect to the base layer.

26. An electronic structure comprising:
   a substrate including a conductive pad thereon;
   a passivation layer on the substrate, the passivation layer having a via hole therein exposing a portion of the conductive pad; and
   a redistribution wiring line on the passivation layer and on the exposed portion of the conductive pad, the redistribution wiring line including a first layer comprising TiW and a second layer comprising at least one of aluminum and/or copper wherein the first layer comprising TiW is between an entirety of the second layer and the passivation layer.

27. An electronic structure according to claim 26, further comprising:
   a second passivation layer on the redistribution wiring line, the second passivation layer having a second via hole therein exposing a portion of the redistribution wiring line;
   an underbump metallurgy layer on the exposed portion of the redistribution wiring line; and
   a solder bump on the underbump metallurgy layer.

28. An electronic structure according to claim 26 wherein an entirety of the second layer comprising at least one aluminum and/or copper is conformal with respect to the first layer comprising TiW.

29. An electronic device comprising:
a substrate having an insulating layer thereon;
a metal base layer on a portion of the insulating layer wherein portions of the insulating layer are free of the metal base layer; and
a metal wiring layer on the metal base layer wherein the metal wiring layer comprises a metal not included in the metal base layer, wherein the metal base layer is between the metal wiring layer and the insulating layer, and wherein the metal base layer includes a lip extending beyond the metal wiring layer wherein the lip of the metal base layer extends beyond the metal wiring layer in a direction parallel with respect to a surface of the substrate a relatively uniform distance around a periphery of the metal wiring layer.

30. An electronic device according to claim 29 wherein the metal base layer comprises titanium-tungsten.

31. An electronic device according to claim 30 wherein the metal wiring layer comprises an aluminum layer.

32. An electronic device according to claim 31 wherein the metal wiring layer includes a titanium layer between the aluminum layer and the metal base layer.

33. An electronic device according to claim 29 wherein the metal base layer of the conductive structure is between an entirety of the metal wiring layer and the insulating layer.

34. An electronic device according to claim 29 wherein an entirety of the metal wiring layer is conformal with respect to the metal base layer.

* * * * *